United States Patent [19]

Vlach

[11] Patent Number: 5,092,780
[45] Date of Patent: Mar. 3, 1992

[54] SYSTEM PERFORMANCE SIMULATOR

[75] Inventor: Martin Vlach, Waterloo, Canada

[73] Assignee: Analogy, Inc., Beaverton, Oreg.

[21] Appl. No.: 643,758

[22] Filed: Jan. 17, 1991

Related U.S. Application Data

[63] Continuation of Ser. No. 918,383, Oct. 14, 1986, abandoned.

[51] Int. Cl.$^5$ ............... A47B 41/00; G06F 15/00; G06G 7/48
[52] U.S. Cl. ................... 434/433; 364/488; 364/578; 364/801
[58] Field of Search ............ 364/578, 488–491, 364/571.03, 801–806; 434/433

[56] References Cited

U.S. PATENT DOCUMENTS

| | | | |
|---|---|---|---|
| 4,215,420 | 7/1980 | Kassakian | 364/802 |
| 4,607,530 | 8/1986 | Chow | 364/578 |
| 4,656,603 | 4/1987 | Dunn | 364/900 |
| 4,677,587 | 6/1987 | Zemany, Jr. | 364/900 |

OTHER PUBLICATIONS

Chichocki et al., "Analogue Simulation of the Non-Linear Transfer Characteristics a Novel Approach", Electronic Circuits and Systems, vol. 2 #1, Jan' 78.
Kohr, "A Method for the Determination of a Differential Equation Model for Simple Non-Linear Systems", IEEE Trans on Elec. Comp., vol. EC 12 #4. Aug.' 63.
Gouyon et al., "Hybrid Simulation of an Absorbtion Process", Proceedings of the 8th AICA Congress on Delfe, Netherlands, Aug. 23–28, 1976.

Primary Examiner—Gregory C. Issing
Attorney, Agent, or Firm—Kolisch, Hartwell, Dickinson, McCormack & Heuser

[57] ABSTRACT

The instant invention is a system performance simulator which includes a library of expression-literate model artifacts, each of which is at least partially representative, mathematically and operatively, of a model element which includes at least one virtual interface point suitable for operative association with another such point. Assembly means are operatively and disconnectably communicative with the library for accessing selected model artifacts and is capable of understanding the representative expression-literacies characterizing the artifacts, for establishing operative associations between interface points of the artifacts to establish an organized assembly of such artifacts. Means are also provided which are operatively communicative with the assembly means for conducting a performance simulation of such an assembly.

20 Claims, 2 Drawing Sheets

SYSTEM PERFORMANCE SIMULATOR

This is a continuation of application Ser. No. 06/918,383, filed Oct. 14, 1986 now abandoned.

BACKGROUND AND SUMMARY OF THE INVENTION

The instant invention relates to a system performance simulator for simulating a system made up of discrete elements and specifically to such a system where the discrete elements may be removed, modified and replaced in the system.

Known system performance simulators include simulators such as SPICE, which is used to simulate the performance of electronic circuits. SPICE is limited in the number and types of electronic elements which may be included in any circuit and requires that a substantial part of the code in the program be modified when an element is replaced or added.

Other circuit simulators, such as SINC, SCEPTRE and ECAP all utilize a connection of elements wherein the elements are built into the code defining the simulator.

An object of the instant invention is to provide an analog simulator which allows a user to insert multiple, selected model artifacts of elements into a topological description of a system.

Another object of the instant invention is to provide a simulator which is operable to modify and generate model artifacts.

A further object of the instant invention is to provide a simulator which allows a user to simulate a system when the system is under extreme environmental conditions.

Still another object of the instant invention is to provide a simulator which is operable to describe and examine internal variables within an element.

The instant invention is a system performance simulator which includes a library of expression-literate model artifacts, each of which is at least partially representative, mathematically and operatively, of a model element which includes at least one virtual interface point suitable for operative association with another such point. Assembly means is operatively and disconnectably communicative with the library for accessing selected model artifacts and is capable of understanding the representative expression-literacies characterizing the artifacts, for establishing operative associations between interface points of the artifacts to establish an organized assembly of such artifacts. Means are also provided which are operatively communicative with the assembly means for conducting a performance simulation of such an assembly.

These and other objects and advantages of the instant invention will become more fully apparent as the description which follows is read in conjunction with the drawings.

DETAILED DESCRIPTION OF A PREFERRED EMBODIMENT

The simulator of the instant invention is operable to simulate the interaction of elements having a variety of characteristics. These characteristics may be such that the model elements are electrical, mechanical or chemical in nature, or wherein the elements may be biological, optical of fluidic in nature. Such elements may, of course, take on other characteristics. For the purposes of the explanation which immediately follows, model elements which are electrical and mechanical in nature will be used to illustrate how a simulator constructed according to the invention may operate.

Figure 1:
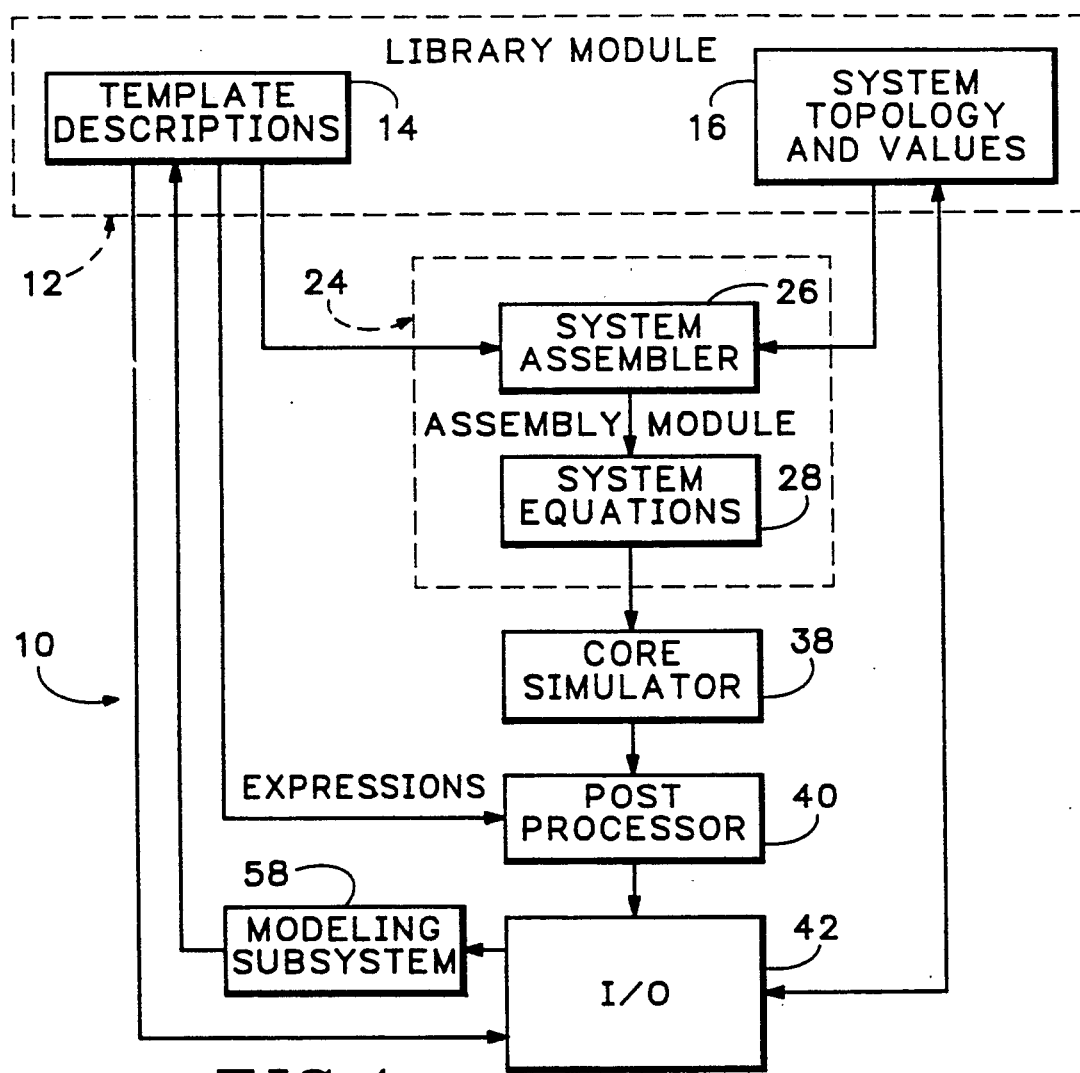
FIG. 1 is a block diagram of the system performance simulator of the invention.

Turning now to FIG. 1, a system performance simulator constructed according to the invention is shown generally at 10. Simulator 10 includes a library module 12. Library 12 includes a collection of template descriptions 14 and a section 16 which includes the system topology and values.

As used herein, the term "template" means a description which includes a description of the algebraic differential equations which define the characteristics of an element. "Element" as used herein, is used to define a physical part which is a nondivisible primitive, i.e., a component, a voltage source, etc. The "component model" is a template which has a specific set of values assigned thereto to describe a specific physical part or, such as a transistor, motor, etc. Component models and templates are also referred to herein as equation based, quantitating-data producing expression-literate model artifacts.

Figure 2:
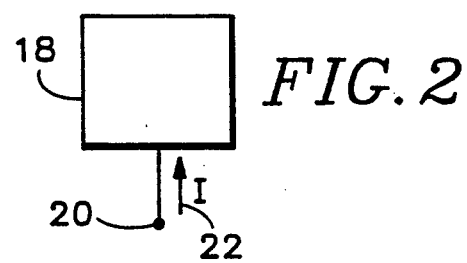
FIG. 2 is a schematic representation of an element of an electronic circuit.

Referring momentarily to FIG. 2, a block 18 is representative of an element. Block 18 includes a virtual interface point, or pin, 20. Arrow 22 represents current flow (I) from pin 20 into block 18. A template for block 18 is represented by:

$$I(Pin) = [Parameters] * [System\ Variables] \qquad (1)$$

wherein the system variables describe the characteristics of the part at a particular pin and the parameters are those values which are descriptive of a particular physical device. System variables may be things such as voltage, current, torque or angular velocity (in the case of a motor shaft). System variables may also be "internal" variables or values of an element, and will be further described later herein. Parameters may be such things as proportionality constants, resistance, inductance, friction coefficients, values representing moments of inertia, etc.

System topology contains a listing of components and the nodes to which the components are connected at their respective pins as well as reference values operable with internal variables of the components.

The information contained in library 12 is transferred into assembly means or module 24 which contains a system assembler 26 and system equations 28.

The system assembler leads to the non-linear algebraic differential system of equations such as:

$$\frac{dq}{dt} + g(v) = f(t) \qquad (2)$$

$$q = c(v) \qquad (3)$$

where:

q is a vector of generalized charges flowing out of each node. In nodal formulation, each component gives the sum of the capacitive currents leaving each node.

v is a vector of independent variables representing things such as the nodal voltages.

g(v) is a vector of non-linear functions representing the static elements. In nodal formulation, each component of this vector gives the sum of the resistive currents leaving each node.

c(v) is a non-linear function defining q in terms of v.

j(t) is a vector of independent sources, which may be a function of time. In nodal formulation, each component of this vector gives the sum of the source currents entering each node.

Once the system of the equations is counted by system equations 28, $$f(v, \dot{v}, t) = 0 \qquad (4)$$

where:

f is a function vector for each variable.

v is the vector of system variables.

t represents time.

Figure 3:
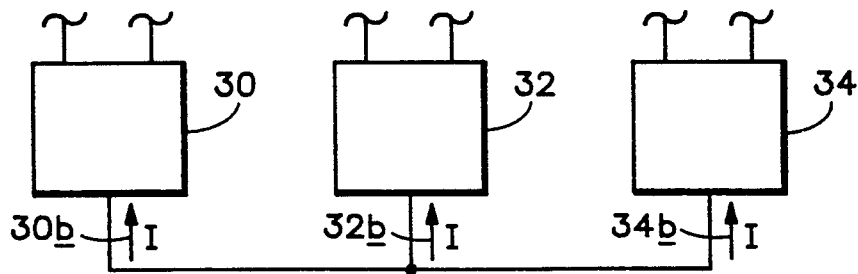
FIG. 3 is a schematic representation of three elements of a circuit which are joined at a node.

System assembler 26 allows external definition of the pieces of the system being simulated. The system assembler then takes the template descriptions and builds a system according to the system topology and values. Referring now to FIG. 3, blocks 30, 32 and 34 are shown. The blocks have a number of virtual interface points extending therefrom among which are pins 30a, 32a and 34a which are joined together at a node 36. Arrows 30b, 32b and 34b represent current flow from node 36 into blocks 30, 32 and 34, respectively.

The assembler then forms an internal data structure which is a system of equations consisting of: 1) the internal equations of all components, and 2) Kirchoff Current Law (KCL) equations at each node. (KCL: The sum of through variables (e.g., current in an electrical case) at a node is equal to zero.)

Additionally, certain additional values may be inserted into the template descriptions from the netlist by the system assembler, such as Frequency, time, temperature, to provide an environmental parameter, thereby resulting in an environmentally dependant quantitative simulation.

Once the system has been assembled, system equations 28 sets up a system of equations to fully describe the system. A core simulator 38 then solves the equations thereby conducting a performance simulation.

The system of equations is solved typically in three stages using classical methods. The first stage utilizes numerical integration algorithms to solve the differential equations. The second stage utilizes a non-linear system of equations solutions to solve the equations formulated in stage one. Finally, the linear system of equations is solved during the iterative scheme of stage two.

Each of the above stages may be solved by any of a number of well-known algorithms. Some of the more commonly used algorithms are: 1l) trapezoidal or Gear's algorithms with variable step size for numerical integration, 2l) Newton-Raphson integration with damping in the case of systems with continuous derivatives, 3) Ketzenelson algorithm or modified Newton-Raphson iteration in the case of piece-wise linear systems, and 4) LU decompositions, sparse or full, with or without pivoting.

Once the system of equations has been solved by the core simulator, post processor 40 is operable to manipulate the system variable values in order to generate an output which may be in a graphic or numerical form which is understandable by the user, and which is displayed on a user interface module 42.

Figure 4:
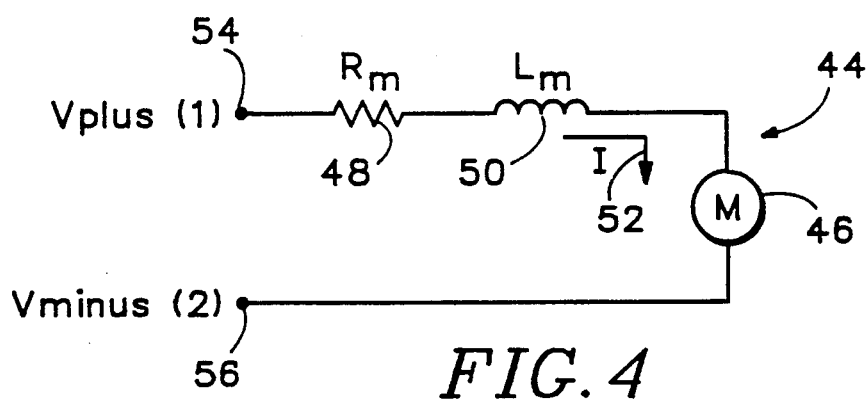
FIG. 4 is a schematic representation of a D.C. electric motor.

An important feature of the instant invention is that it provides the user the capability to define and describe a model artifact, or template, which relates to a real thing, such as an electric motor. Referring now to FIG. 4, a schematic representation of an electromechanical system including a D.C. motor is shown generally at 44. System 44 includes motor 46, a resistance 48 and an inductance 50. Current through the system is represented by an arrow 52. System 44 includes pins 54 and 56. System 44 may be mathematically described by the following:

$$V_{1-2} = K_m w = R_m I - L_m \dot{I} \qquad (5)$$

$$T_{SHAFT} = K_t I - jw - Dw \qquad (6)$$

$$POWER = I(V_1 - V_2) \qquad (7)$$

where:

$V_{1-2}$ is the back emf across pins 54, 56.

$K_m$ is a proportionality constant related to the speed of the motor and the back emf.

w is the angular velocity of the motor shaft.

$R_m$ is the resistance in the windings of the motor.

$L_m$ is the inductance in the windings of the motor.

I is the current through the system.

$T_{SHAFT}$ is the torque available on the shaft of the motor.

$K_t$ is a torque proportionality constant which, in an ideal motor, would be proportional to the current.

j is the moment of inertia for the motor.

D is the frictional or viscous loss component for the motor.

A template for system 44 may be generated with the assistance of modeling subsystem 58 (FIG. 1). A template, as previously noted, is a description of the algebraic differential equations which define the characteristics of the generic element being described. The application of a specific set of values to the template results in what is referred to herein as a component or component model and describes specific part or device. In most instances, a user would generate a template and the specific set of values for the template in order to describe a specific part or device which he desired to use in a circuit.

To generate a template, the user first identifies or names the template and designates system variables and parameters. The user next identifies "pins" which will be used by the system assemblers to join the component model to other component models, thereby forming nodes. The equations for the element are next defined. At this point the user may also define EXPRESSIONS. EXPRESSIONS are those internal values which are not directly joined to other elements but which may be useful and which may be generated by the system and which may or may not follow the KCL. An example of a useful EXPRESSION is a calculation of power for a motor, as set forth in equation 7, above, which is not a necessary differential algebraic equation as far as relating the performance of the motor to other elements of the system, but which is a desirable piece of information. As illustrated in FIG. 1, EXPRESSIONS are taken directly from the template descriptions and manipulated by postprocessor 40.

In addition to defining system variables, parameters, pins and equations, the user may also assign values to the parameters, thereby forming a component model. An example of a template might appear as follows:

```
TEMPLATE MOTOR    (Vplus, Vminus, shaft)(Km, K_t, j, D,
                   Rm, Lm)
PIN THROUGH i ACROSS v    Vplus, Vminus;
PIN THROUGH t ACROSS w    shaft
REAL          Km = 1,
              K_t = 1,
              j = 1,
              D = 1,
              R_m = 1,
              Lm = 1,
              power;
{
VAR I cur;
EQUATION    {
            I(Vplus)    = cur;
            I(Vminus)   = -cur;
            T(shaft)    = K_t*cur-j*(d_by_dt(w(shaft)))-
D*w(shaft);
            V(Vplus)-V(Vminus)  = Km*w(shaft)-Rm*cur-
Lm*(d_by_dt(cur));
            }
EXPRESSION  {
            POWER = CUR *(V(Vplus)-V(Vminus))
            }
```

Figure 5:
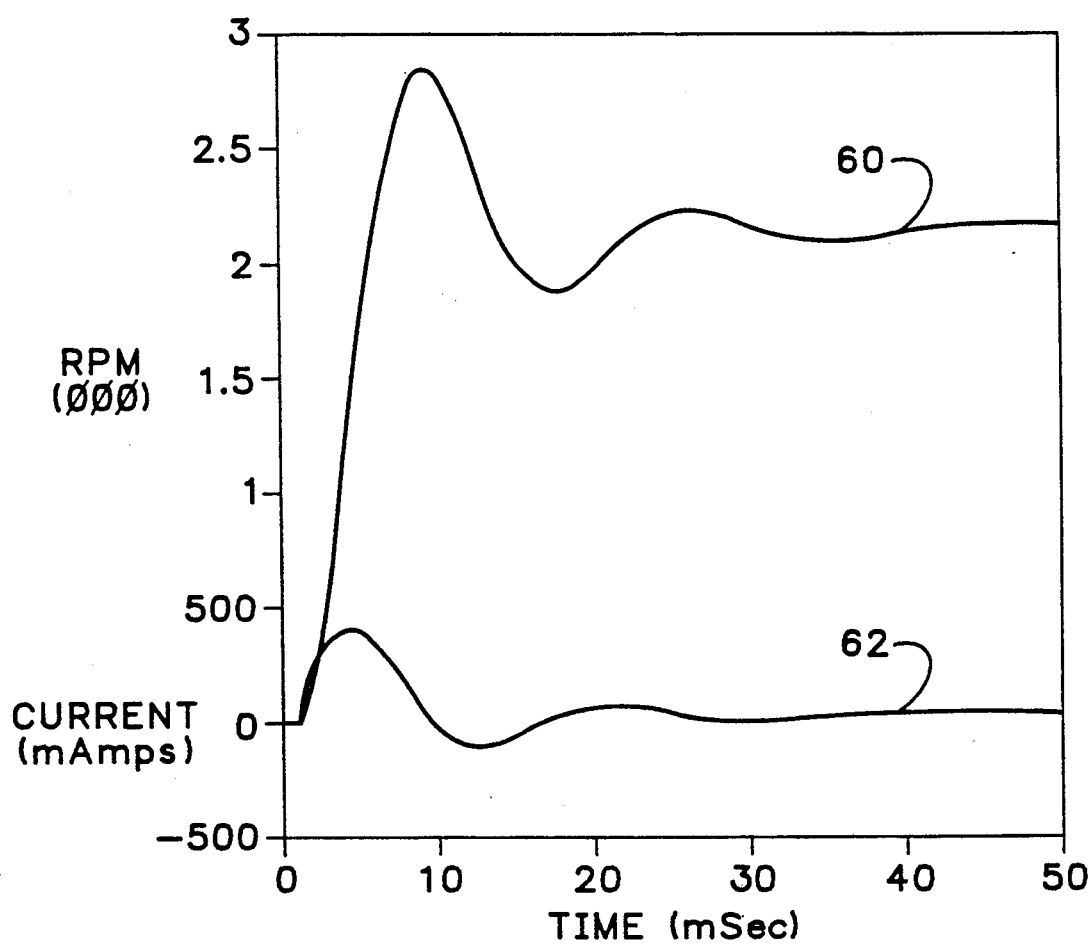
FIG. 5 depicts a graph of motor performance as generated by the simulator of the invention.

FIG. 5 depicts a graph of motor performance as generated by the core simulator and post processor. The upper line 60 in FIG. 5 depicts motor speed in thousands of revolutions per minute (RPM). The lower line 62 depicts current running through the motor in milleamps. The time line at the bottom is marked in milleseconds. FIG. 5 represents the step response of a theoretical motor wherein $K_m$ equals 4.5, $K_t$ equals 6.2, j equals 0.004, D equals 0.1, $R_m$ equals 5 and $L_m$ equals 0.02. Thus an operator may generate a graph, such as shown in FIG. 5, by entering a specific set of values into the template which mathematically described the characteristics of the motor. Other parts or devices may be included in a system, the electromechanical operation of the system may be simulated, and the performance of the system may be output in graphic or numeric form.

The simulator of the invention is also able to utilize a macro-model as a substitute for the complete mathematical expression of an element. For instance, an operational amplifier may be reduced to a small number of components which will perform as does the complete operational emplifier and effectively substitute a simplified mathematical model for a much more complex one.

From the description given above relating to an electromechanical system, those skilled in the other technical fields mentioned and suggested earlier will see how to implement this invention to perform simulations in these other fields. Although a preferred embodiment of the invention has been disclosed, variations and modifications may be made without departing from the spirit of the invention.

It is claimed and desired to secure by Letters Patent:

1. A system performance simulator for simulating a system containing real-world model elements comprising:

a library of equation based, quantitative-data producing expression-literate model artifacts, each at least partially representing, mathematically and operatively, a model element, which includes at least one virtual interface point suitable for operative association with another such point, wherein each expression-literate model artifact includes at least one differential equation that describes the characteristics, including conservation requirements, of the real-world model element, assembly means operatively and disconnectably communicative with said library for accessing selected model artifacts, and capable of understanding the respective expression-literacies characterizing said artifacts, for establishing operative associations between interface points of the same to establish an organized assembly of such artifacts, and means operatively communicative with said assembly means for conducting a conserved performance simulation of such an assembly.

2. The simulator of claim 1 wherein said model elements are electrical in nature.

3. The simulator of claim 1 wherein said model elements are mechanical in nature.

4. The simulator of claim 1 wherein said model artifacts are chemical in nature.

5. The simulator of claim 1 wherein said model artifacts are biological in nature.

6. The simulator of claim 1 wherein said model elements are optical in nature.

7. The simulator of claim 1 wherein said model elements are fluidic in nature.

8. The simulator of claim 1 wherein said model elements include any mixed combination of linear or non-linear elements whose respective natures fall in the group consisting of electrical elements, mechanical elements, chemical elements, biological elements, optical elements and fluidic elements.

9. A system performance simulator for simulating a conservative, closed system of real-world model elements comprising:

a modeling subsystem employable to create equation based, quantitative-data producing expression-literate model artifacts, including templates, each of which represents mathematically and operatively, a real-world model element, which includes at least one virtual interface point suitable for operative association with another such point, including environmental parameters for each expression-literate model artifact, wherein each template includes at least one algebraic differential equation that describes the characteristics, including conservation requirements, of the real-world model element, assembly means operatively and disconnectably communicative with said subsystem for accessing model artifacts created thereby, capable of understanding and establishing operative associations between interface points of the same to establish an organized assembly of such artifacts, and means opertively communicative with said assembly means for conducting an environmentally dependent, conservative performance simulation of such an assembly.

10. The simulator of claim 9 wherein said model elements include any mixed combination elements whose respective natures fall in the group consisting of electrical elements, mechanical elements, chemical elements, biological elements, optical elements and fluidic elements.

11. A Quantitative system performance simulator for simulating a system of real-world model elements comprising:

a library of equation based, quantitative-data producing expression-literate model artifacts, each at least partially representing a real-world model element, which includes at least one virtual interface point suitable for connection with another such point, wherein said model elements may have linear or non-linear characteristics, each artifact including at least one mathematical differential equation which defines the characteristics of the real-world model element, including conservation requirements, a predefined set of quantitative values, including environmental parameters, which, when correlated with a model artifact, represents a real-world model element, assembly means operably and disconnectably communicative with said library for accessing selected model artifacts, and capable of understanding the respective expression-literacies characterizing said artifacts, for establishing operative association between interface points of the same to establish an organized assembly of such artifacts into a system, the assembly means being operable to correlate an individual artifact with a set of quantitative values for the individual artifact and means operably communicative with said assembly means for conducting a quantitative, conservative environmentally dependent performance simulation of the assembled system.

12. The simulator of claim 11 wherein said model elements include any mixed combination elements whose respective natures fall in the group consisting of electrical elements, mechanical elements, chemical elements, biological elements, optical elements and fluidic elements.

13. The simulator of claim 11 which includes a modeling subsystem for creating said model artifacts which is connectable to said library for transferring said model artifacts thereto.

14. The simulator of claim 13 wherein said model elements include any mixed combination elements whose respective natures fall in the group consisting of electrical elements, mechanical elements, chemical elements, biological elements, optical elements and fluidic elements.

15. A system performance simulator for simulating a system of real-world model elements comprising:

a library module including:

a template set, wherein each template in the set includes at least one algebraic differential equation which defines the physical characteristics, including conservation requirements, of a real-world model element, each template having at least one virtual interface point for connection with another such point, a set of quantitative values which, when correlated with a template, form a component model which represents, mathematically and operatively, a real-world model element, and a system topology which defines how the virtual interface points of the component models are connected, an assembly module for combining selected templates and quantitative values to form said component models and for connecting said virtual interface points thereof according to said system topology, thereby forming a set of algebraic differential equations representative of the system of real-world model elements, and a core simulator operatively connected with said assembly module for solving the set of algebraic differential equations thereby providing a mathematical simulation of the system of real-world model elements.

16. The simulator of claim 15 wherein said model elements include any mixed combination of model elements whose respective natures fall in the group consisting of any system made up of model elements which obey laws of conservation.

17. The simulator of claim 15 which includes a modeling subsystem for creating said model artifacts which is connectable to said library for transferring said model artifacts thereto.

18. A system performance simulator for simulating a system of real-world model elements comprising:

a library module including:

a template set, wherein each template in the set includes at least one algebraic differential equation which defines the physical characteristics, including conservation requirements, of a real-world model element, each template having at least one virtual interface point for connection with another such point, a set of quantitative values, including environmental parameters, which, when correlated with a template, form a component model which represents, mathematically and operatively, a real-world model element, and a system topology which defines how the virtual interface points of the component models are connected, an assembly module for combining selected templates and quantitative values to form said component models and for connecting said virtual interface points thereof according to said system topology, thereby forming a set of algebraic differential equations representative of the system of real-world model elements, and a core simulator operatively connected with said assembly module for solving the set of algebraic differential equations thereby providing a mathematical, environmentally dependant, conservative simulation of the system of real-world model elements.

19. The simulator of claim 18 wherein said model elements include any mixed combination elements whose respective natures fall in the group consisting of any system made up of model elements which obey laws of conservation.

20. The simulator of claim 18 which includes a modeling subsystem for creating said model artifacts which is connectable to said library for transferring said model artifacts thereto.

* * * * * ated]

REEXAMINATION CERTIFICATE (2621st)
United States Patent [19]
Vlach

[11] B1 5,092,780
[45] Certificate Issued   Jul. 11, 1995

[54] SYSTEM PERFORMANCE SIMULATOR

[75] Inventor: Martin Vlach, Waterloo, Canada

[73] Assignee: Analogy, Inc., Beaverton, Oreg.

Reexamination Requests:
No. 90/003,032, Apr. 15, 1993
No. 90/003,425, May 4, 1994
No. 90/003,498, Jul. 7, 1994

Reexamination Certificate for:
Patent No.: 5,092,780
Issued: Mar. 3, 1992
Appl. No.: 643,758
Filed: Jan. 17, 1991

Related U.S. Application Data

[63] Continuation of Ser. No. 918,383, Oct. 14, 1986, abandoned.

[51] Int. Cl.$^6$ .................... A47B 41/00; G06F 15/00; G06G 7/48
[52] U.S. Cl. .................... 434/433; 364/488; 364/578; 364/801
[58] Field of Search .............. 364/801–803, 364/805–806, 488–491, 578; 395/500, 919–921; 371/23; 434/433

[56] References Cited

U.S. PATENT DOCUMENTS

| | | |
|---|---|---|
| 4,215,420 | 7/1980 | Kassakian . |
| 4,607,530 | 8/1986 | Chow . |
| 4,638,442 | 1/1987 | Bryant et al. . |
| 4,656,603 | 4/1987 | Dunn . |
| 4,677,587 | 6/1987 | Zemany, Jr. . |

OTHER PUBLICATIONS

"A Generalized Interactive network Analysis and Simulation System," 1972, C. William Gear.
"A Universal Language for Continuous Network Simulation," May 1977, Thomas Fred Runge.
"A Structured Model Language for Large Continuous Systems," May 1978, Hilding Elmqvist.
"Simulation of Continuous Networks with Model," Dec. 1978, Mitchell G. Roth and Thomas F. Runge.
U.S. Pat. No. 4,656,603 to Dunn.
"An Interactive Graphic Modeling System," Apr. 1969, by C. W. Gear.
"A Generalized Interactive Network Analysis and Simulation System," 1972, by C. William Gear.
"Simulation of Continuous Networks with Model," Dec. 1978, by Mitchell G. Roth and Thomas F. Runge.
"A Structured Model Language for Large Continuous Systems," May 1978, Hilding Elmqvist.
"Simnon, An Interactive Simulation Program for Non-linear Systems," Apr. 1975, H. Elmqvist.
"The DRAGON User's Manual," Aug. 1978, Peter Watterberg and Virginia Lo.
"A Universal Language for Continuous Network Simulation," May 1977, Thomas Fred Runge.
"1–G Spice, A Circuit Designer's Dream," Jun. 1983, James C. Bowers.
"Enhanced Spice Simulator Speeds Analogue Design," Feb. 4, 1986, Jean–Noel LeBrun and Raffi Bushen.
"A Short Introduction to Nutmeg," Mar. 20, 1986, Wayne Christopher.
"A Short Introduction to SPICE3," Mar. 20, 1986, Wayne Christopher.
"A Tutorial for Spice3/Nutmeg," Mar. 20, 1986, Sanford Staab.
"UNIX Programmer's Manual," Mar. 20, 1986, 4th Berkeley Distribution.
"SIMMON–An Interactive Simulation Program–Implementation," Aug. 1978, H. Elmqvist.
"Machine Code Generation for SIMON On Vax–11," May 1981, T. Essebo.
A Generalized Interactive Network Analysis and Simulation System, William Gear, First USA–Japan Computer Conference, 1972.
*Advanced Statistical Analysis Program (ASTAP)*, Program Reference Manual, program No. 5796–PBH, IBM Corporation, 1973.
Elmqvist, H., *SIMNON: An Interactive Simulation Program for Non–linear Systems*, User's Manual, report 7502, Dept. of Automatic Control, Lund Inst. of Tech., Lund, Sweden, Apr. 1975.
Elmqvist, Hilding, *A Structured Model Language for Large Continuous Systems*, Lund Inst. of Tech., LUTFD2/TFRT–1015/1–226/May 1978.
ASTEC 3: Simulation of Electric and Electronic Circuits, and Other Complex Systems, User Manual, SIA Computer Services, London, United Kingdom, 1984.

Ruehli et al., *Circuit Analysis, Logic Simulation, and Design Verification for VLSI*, Proceedings of the IEEE, vol. 71, No. 1, Jan. 1983.

Scheffer et al., *Design and Simulation of VLSI Circuits*, Hewlett-Packard Journal, vol. 32, No. 6, Jun. 1981.

Newton et al., *Design Aids for VLSI: The Berkeley Perspective*, IEEE Transactions on Circuits and Systems, vol. CAS-28, No. 7, Jul. 1981.

Hachtel et al., *A Survey of Third–Generation Simulation Techniques*, Proceedings of the IEEE, vol. 69, No. 10, Oct. 1981.

Chichocki et al., *Transfer Characteristics: A Novel Approach*, Electronic Circuits and Systems, vol. 2, No. 1, Jan. 1978.

Gouyon et al., *Hybrid Simulation of an Absorbtion Process*, Proceedings of the 8th AICA Congress, Delft, Netherlands (23–28 Aug. 1976).

Bowers et al., *A Survey of Computer–Aided–Design and Analysis Programs, 1 AFAPL–TR–76–33, Apr. 1976.*

Kohr, *A Method for the Determination of a Differential Equation Model for Simple Nonlinear Systems*, IEEE Transactions on Electronic Computers, vol. EC-12, No. 4, Aug. 1963.

Roth et al, "Simulation of Continuous Networks with Model", Dec. 1978 Accession# 0110807.

Elmqvist, "A Structured Model Language for Large Continuous Systems", May 1978.

*Primary Examiner*—Gregory C. Issing

[57] ABSTRACT

The instant invention is a system performance simulator which includes a library of expression-literate model artifacts, each of which is at least partially representative, mathematically and operatively, of a model element which includes at least one virtual interface point suitable for operative association with another such point. Assembly means are operatively and disconnectably communicative with the library for accessing selected model artifacts and is capable of understanding the representative expression-literacies characterizing the artifacts, for establishing operative associations between interface points of the artifacts to establish an organized assembly of such artifacts. Means are also provided which are operatively communicative with the assembly means for conducting a performance simulation of such an assembly.

REEXAMINATION CERTIFICATE ISSUED UNDER 35 U.S.C. 307

NO AMENDMENTS HAVE BEEN MADE TO THE PATENT.

AS A RESULT OF REEXAMINATION, IT HAS BEEN DETERMINED THAT:

Claim 1-20 are cancelled.

* * * * *